United States Patent [19]

Inaishi et al.

[11] Patent Number: 5,213,940
[45] Date of Patent: May 25, 1993

[54] IMAGE RECORDING METHOD USING PHOTOSENSITIVE MICROCAPSULES

[75] Inventors: Kouji Inaishi, Okazaki; Naomichi Kobayashi, Nagoya, both of Japan

[73] Assignee: Brother Kogyo Kabushiki Kaisha, Japan

[21] Appl. No.: 864,895

[22] Filed: Apr. 3, 1992

[30] Foreign Application Priority Data

May 15, 1991 [JP] Japan .................... 3-110584

[51] Int. Cl.$^5$ .................... G03C 5/56; G03C 1/72
[52] U.S. Cl. .................... 430/138; 430/200; 430/203; 430/253; 430/254; 430/256; 430/350; 430/353
[58] Field of Search ............ 430/138, 200, 203, 252, 430/253, 254, 260, 350, 353, 281, 964, 256

[56] References Cited

U.S. PATENT DOCUMENTS

| | | |
|---|---|---|
| 2,548,366 | 4/1951 | Green et al. |
| 3,775,424 | 11/1973 | Farber |
| 4,399,209 | 8/1983 | Sanders et al. .............. 430/138 |
| 4,416,966 | 11/1983 | Sanders et al. .............. 430/138 |
| 4,440,846 | 4/1984 | Sanders et al. .............. 430/138 |
| 4,554,235 | 11/1985 | Adair et al. .............. 430/138 |
| 4,576,891 | 3/1986 | Adair et al. .............. 430/138 |
| 4,587,194 | 5/1986 | Adair et al. .............. 430/138 |
| 4,764,451 | 8/1988 | Ishikawa .............. 430/138 |
| 4,784,932 | 11/1988 | Nakamura et al. .............. 430/138 |
| 5,039,589 | 8/1991 | Takahashi .............. 430/138 |

FOREIGN PATENT DOCUMENTS

| | | |
|---|---|---|
| 48-95420 | 12/1973 | Japan . |
| 51-16807 | 2/1976 | Japan . |
| 57-124343 | 8/1982 | Japan . |
| 57-179836 | 11/1982 | Japan . |
| 57-197538 | 12/1982 | Japan . |
| 61-275742 | 12/1986 | Japan . |
| 62-174195 | 7/1987 | Japan . |
| 62-209444 | 9/1987 | Japan . |

Primary Examiner—Marion E. McCamish
Assistant Examiner—Tanis L. Dote
Attorney, Agent, or Firm—Oliff & Berridge

[57] ABSTRACT

The present invention relates to an image recording method utilizing photosensitive microcapsules. These photosensitive microcapsules have characteristics of being rendered hardenable upon exposure. Further, only the hardenable photosensitive microcapsules can be hardened. In this image recording method, an optional image pattern is initially exposed to a photosensitive recording medium having thereon the photosensitive microcapsules for rendering only the exposed photosensitive microcapsules hardenable corresponding to the image pattern. Subsequently, the exposed photosensitive recording medium is heated to harden only the hardenable photosensitive microcapsules. Further, the photosensitive recording medium is entirely exposed again with light to render the unhardened photosensitive microcapsules hardenable. Finally, at the transferring step, the recording medium is superposed with a medium to be transferred such that the medium to be transferred is opposed to the surface of the recording medium having thereon the photosensitive microcapsules. Pressure and heat are applied to the recording medium and the medium to be transferred which are superposed with each other to transfer the contents in the unhardened hardenable photosensitive microcapsules onto the medium to be transferred as well as to harden the transferred contents to record an image on the medium to be transferred. According to this image recording method, an excellent image can be recorded on a medium to be transferred without causing the transferred contents to excessively soak into or repel from the medium to be transferred.

6 Claims, 7 Drawing Sheets

IMAGE RECORDING METHOD USING PHOTOSENSITIVE MICROCAPSULES

BACKGROUND OF THE INVENTION

1. Field of the Invention

The present invention relates to an image recording method for recording an image by utilizing photosensitive microcapsules and, more particularly, to an image recording method utilizing photosensitive microcapsules which are rendered hardenable and which are further hardened by heating.

2. Description of the Related Art

Conventional image recording methods utilizing photosensitive microcapsules are disclosed, for example, in U.S. Pat. Nos. 2,548,366, 3,775,424, 4,399,209, 4,440,846, 4,416,966, 4,554,235, 4,576,891 and 4,587,194 and in Japanese Patent Laid-Open Nos. Sho 48-95420, 51-16807, 57-124343, 57-179836, 57-197538 and 62-174195.

These image recording methods utilize three kinds of photosensitive microcapsules each of which encapsulates therein a dye precursor, a dye or a pigment of cyan, magenta and yellow, respectively. The characteristics of each photosensitive microcapsule are as follows. Specifically, a photosensitive microcapsule encapsulating therein a precursor, a dye or a pigment of cyan is hardened upon exposure with red light having a wavelength in the vicinity of 650 nm. Similarly, a photosensitive microcapsule encapsulating therein a precursor, a dye or a pigment of magenta is hardened upon exposure with green light having a wavelength in the vicinity of 550 nm. A photosensitive microcapsule encapsulating therein a precursor, a dye or a pigment of yellow is hardened upon exposure with blue light having a wavelength in the vicinity of 450 nm.

A photosensitive recording medium and a transfer medium are used for performing image recording which utilizes such characteristics of the photosensitive microcapsules. The photosensitive recording medium comprises a substrate and a layer of three kinds of photosensitive microcapsules deposited uniformly on the substrate. The medium to be transferred comprises the substrate and a developer layer or an absorbent layer uniformly deposited thereon. When the photosensitive microcapsules encapsulate a dye precursor, a usable transfer medium has a developer deposited thereon. The developer forms color by the reaction with the dye precursor which flows out upon rupture of the photosensitive microcapsules. When the photosensitive microcapsules encapsulate a dye or a pigment, a usable transfer medium has an absorbent deposited thereon. The absorbent absorbs the dye or pigment which flows out upon rupture of the photosensitive microcapsules.

In this image recording method, red (R), green (G) and blue (B) lights corresponding to an original image are simultaneously or independently irradiated to the photosensitive microcapsule layer of the photosensitive recording medium, whereby only photosensitive microcapsules exposed with light having a predetermined wavelength are hardened. Accordingly, a chemical latent image corresponding to the original image is formed on the photosensitive microcapsule layer uniformly deposited on the substrate. Further, the photosensitive recording medium and the transfer medium are superposed with each other such that the photosensitive microcapsule layer having the chemical latent image formed thereon is opposed to the surface of the transfer medium on which the developer or absorbent is deposited. Thereafter, pressure or heat is applied to the two media for rupturing the unhardened photosensitive microcapsules. The contents encapsulated in the ruptured photosensitive microcapsules are transferred onto the transfer medium having the developer or absorbent deposited thereon, whereby an image is recorded on the transfer medium.

An image recording method disclosed in Japanese Patent Laid-Open No. 61-275242 employs photosensitive microcapsules having remarkably high sensitivity, thereby rapidly obtaining a recording image of high quality with excellent reproduction.

These image recording methods utilize three kinds of photosensitive microcapsules each of which encapsulates therein a dye precursor, a dye or a pigment of cyan, magenta and yellow, respectively. The characteristics of each photosensitive microcapsule are as follows. Specifically, a photosensitive microcapsule encapsulating therein a precursor, a dye or a pigment of cyan is rendered hardenable when exposed with red light having a wavelength in the vicinity of 650 nm, and further is hardened by heating. Similarly, a photosensitive microcapsule encapsulating therein a precursor, a dye or a pigment of magenta is rendered hardenable when exposed with green light having a wavelength in the vicinity of 550 nm, and further is hardened by heating. A photosensitive microcapsule encapsulating therein a precursor, a dye or a pigment of yellow is rendered hardenable when exposed with blue light having a wavelength in the vicinity of 450 nm, and further is hardened by heating.

A photosensitive recording medium and a transfer medium are used for performing image recording which utilizes such characteristics. The photosensitive recording medium comprises a substrate and a photosensitive microcapsule layer of three kinds of photosensitive microcapsules uniformly deposited on the substrate. The transfer medium comprises a substrate and a developer layer or an absorbent layer uniformly deposited thereon. When the photosensitive microcapsules encapsulate a dye precursor, a usable transfer medium has a developer deposited thereon. The developer forms color by the reaction with the dye precursor which flows out upon rupture of the photosensitive microcapsules. When the photosensitive microcapsules encapsulate a dye or a pigment, a usable medium to be transferred has an absorbent deposited thereon. The dye or pigment is too high in permeation into paper as well as non-volatile. If the dye or pigment is transferred to a transfer medium to be transferred having no absorbent layer such as a plain sheet, the transfer medium gets wet. This absorbent absorbs the dye or pigment which flows out upon rupture of the photosensitive microcapsules.

Initially, red, green and blue lights corresponding to an original image are simultaneously or independently radiated to the photosensitive microcapsule layer of the photosensitive recording medium, thus causing stones or pits to form in the photosensitive microcapsules such that the photosensitive microcapsules irradiated with light having a predetermined wavelength are rendered hardenable. Subsequently, the hardenable photosensitive microcapsules are hardened by heating, thereby forming on the photosensitive microcapsule layer a chemical latent image corresponding to the original image. Further, the photosensitive recording medium and the transfer medium are superposed with each other such that the photosensitive microcapsule layer having the chemical latent image formed thereon is opposed to the surface of the transfer medium on which the developer or absorbent is deposited. Thereafter, pressure or heat is applied to the two media for rupturing the unhardened photosensitive microcapsules. The contents encapsulated in the ruptured photosensitive microcapsules are transferred onto the transfer medium having the developer or absorbent deposited thereon, whereby an image is recorded on the medium to be transferred.

However, the above-mentioned conventional and general image recording method using photosensitive microcapsules can record an image only on the specific transfer medium on which the developer or absorbent is deposited. In other words, the image can be recorded onto the transfer medium having the developer or absorbent deposited thereon, whereas the image recording cannot be carried out on an optional medium to be transferred such as a plain sheet.

Accordingly, there has been proposed an image recording method disclosed in Japanese Patent Laid-Open No. Sho 62-209444 in which a transfer medium having the developer deposited thereon is not required, i.e., an image can be recorded on a transfer medium such as a plain sheet. This method employs a photosensitive recording medium in which photosensitive microcapsules and a developer are deposited on a single substrate as well as a transfer medium such as a plain sheet. According to this method, however, the contents encapsulated in the photosensitive microcapsules may soak into or be repelled from the transfer medium in excess depending on a type of the transfer medium, so that an excellent recorded image cannot be obtained. Specifically, this method entails a problem such that the contents in the photosensitive microcapsules undesirably soak into the plain sheet or are repelled from, for example, an overhead projector (OHP) sheet.

SUMMARY OF THE INVENTION

The present invention is accomplished in order to solve the above-mentioned problems, and aims to provide an image recording method in which an excellent image can be recorded on a transfer medium.

In order to accomplish this object, the image recording method according to the present invention utilizes photosensitive microcapsules for recording an image, the microcapsules being hardenable upon exposure and the hardenable microcapsules being hardened by heating, the image recording method comprising a step of exposing an image pattern to a photosensitive recording medium having thereon the photosensitive microcapsules for forming hardenable microcapsules corresponding to the image pattern, a step of heating the exposed photosensitive recording medium for hardening the hardenable photosensitive microcapsules, a step of re-exposing the entire surface of the photosensitive recording medium having thereon the photosensitive microcapsules, for rendering all of the unexposed photosensitive microcapsules hardenable, and a step of applying pressure and heat to the photosensitive recording medium and the transfer medium which are superposed with each other such that the surface of the photosensitive recording medium on which the photosensitive microcapsules are deposited is opposed to the transfer medium, thereby rupturing the unhardened photosensitive microcapsules rendered hardenable for transferring their contents onto the transfer medium and for hardening these hardenable contents.

According to the thus structured image recording method of the present invention, an image pattern is initially radiated to a photosensitive recording medium having photosensitive microcapsules thereon to render the radiated photosensitive microcapsules hardenable only in the exposed photosensitive microcapsules corresponding to the image pattern. Subsequently, the exposed photosensitive recording medium is heated for hardening only the hardenable photosensitive microcapsules. Further, the exposed photosensitive recording medium is entirely exposed again with light for rendering the photosensitive microcapsules having no latent image species formed therein hardenable. Finally, the photosensitive recording medium is superposed with the transfer medium with its microcapsule bearing surface in face-to-face contact with the medium to be transferred, and then, heat and pressure are applied thereto for transferring the contents in the unhardened hardenable photosensitive microcapsules onto the transfer medium and for hardening these transferred contents, thereby recording an image onto the transfer medium.

After the above-mentioned heating step, the following process can be adopted. Specifically, the microcapsule bearing surface of the photosensitive recording medium is superposed with the transfer medium. A pressure is then applied thereto for transferring the contents in the unhardened hardenable photosensitive microcapsules to the transfer medium. Thereafter, the entire transfer medium is again irradiated. Finally, the transfer medium is heated.

BRIEF DESCRIPTION OF THE DRAWINGS

A preferred embodiment of the present invention will be described in detail with reference to the following figures, wherein.

DETAILED DESCRIPTION OF THE PREFERRED EMBODIMENTS

A first embodiment according to the present invention will be explained hereinbelow with reference to the drawings.

An explanation will first be provided of a structure of a photosensitive recording medium 3 used for this embodiment on which photosensitive microcapsules 2 are deposited thereon.

This photosensitive recording medium 3 comprises a substrate 1 and a large number of photosensitive microcapsules 2 deposited thereon. The substrate 1 is made of, for example, polyethylene terephthalate (PET) and has light transparent characteristics. The structure of the chemical composition or the like of the photosensitive microcapsules 2 used for the photosensitive recording medium 3 is disclosed in detail in Japanese Laid-Open No. 61-275742, so that the explanation thereof is omitted here. The characteristics of the photosensitive microcapsule will be briefly explained hereinbelow. Each of the photosensitive microcapsules 2 encapsulates a dye or a pigment (hereinafter referred to as a dye) of black. Stones or pits are formed in the microcapsules upon exposure with light having any wavelength thus rendering the exposed microcapsules hardenable. The hardenable photosensitive microcapsule 2A is then hardened by heating to become a hardened microcapsule 2B.

Figure 1:
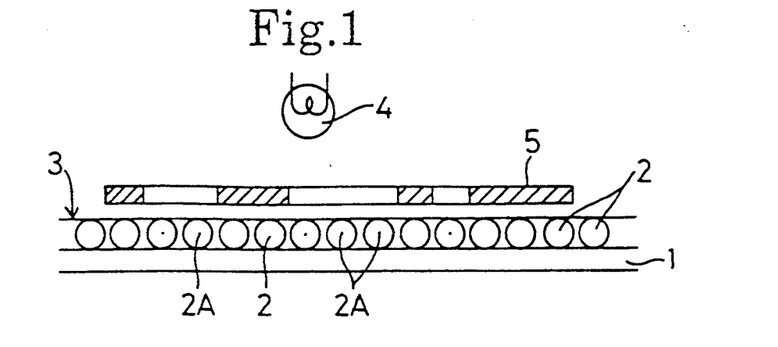
FIG. 1 is a view showing a step of exposing a photosensitive recording medium in the first embodiment.
Figure 2:
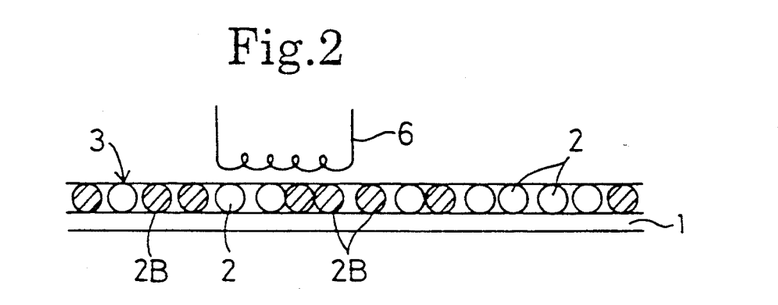
FIG. 2 is a view showing a step of heating the photosensitive recording medium in the first embodiment.
Figure 3:
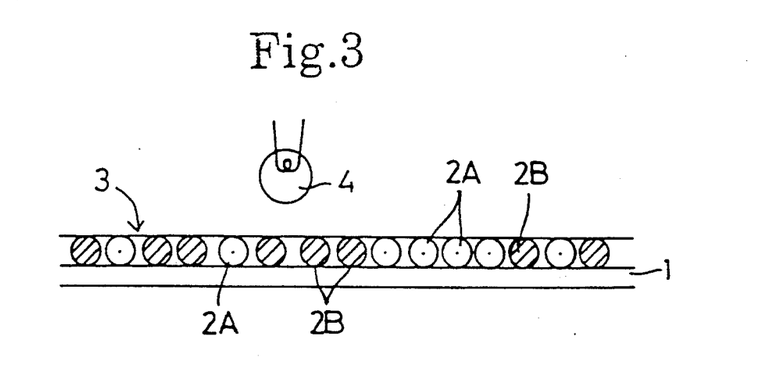
FIG. 3 is a view showing a step of re-exposing the photosensitive recording medium in the first embodiment.
Figure 4:
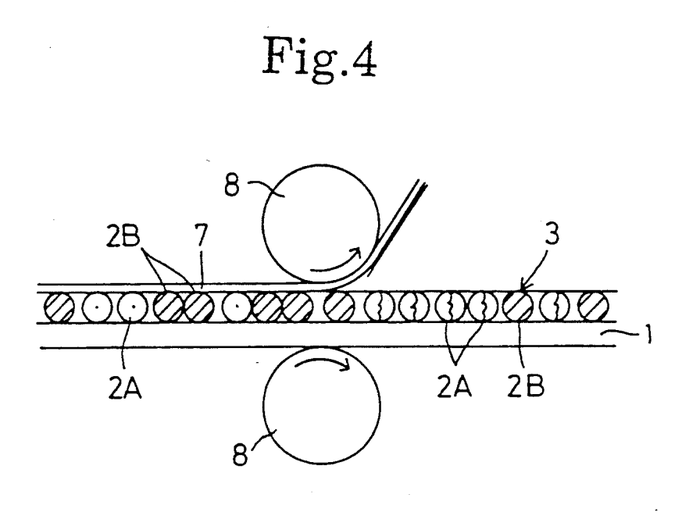
FIG. 4 is a view showing a step of transferring an image onto a transfer medium in the first embodiment.

An image recording method of the first embodiment will be explained with reference to FIGS. 1 to 4. FIG. 1 is a view showing a step of exposing the photosensitive recording medium in the first embodiment. FIG. 2 is a view showing a step of heating the photosensitive recording medium in the first embodiment. FIG. 3 is a view showing a step of re-exposing the photosensitive recording medium in the first embodiment. FIG. 4 is a view showing a step of transferring an image onto a transfer medium in the first embodiment.

The image recording method of this embodiment comprises an exposing step, a heating step, a re-exposing step and a transferring step, each of which will be explained hereinbelow. Explained in this embodiment is a case where the surface of the photosensitive recording medium 3 having thereon the photosensitive microcapsules 2 is exposed once by using an original image having light transparent characteristics.

To begin with, the exposing step shown in FIG. 1 will be explained. At this step, an original document 5 having light transparent characteristics is placed on the surface of the photosensitive recording medium 3 having thereon the photosensitive microcapsules 2. An image is printed in advance on the original document 5. Light cannot pass through the portion of the document on which the image is recorded. As a result, the photosensitive microcapsules 2 below this portion are not exposed with light. A halogen lamp 4, which is a light source, arranged above the original document 5 is turned on to expose the photosensitive microcapsules 2 on the photosensitive recording medium 3 with light passing through the original document 5, thereby producing light-exposed photosensitive microcapsules 2 and unexposed photosensitive microcapsules 2 due to the image printed in advance on the original document 5. Each of the photosensitive microcapsules exposed with light is a hardenable microcapsule 2A. Each of the photosensitive microcapsules 2 which is not exposed with light is not hardenable and remains intact. In other words, the unexposed photosensitive microcapsules 2 are not hardened by heat application. In this way, a first chemical latent image, corresponding to the image pattern on the original document 5 and comprising the unexposed photosensitive microcapsules 2 and exposed hardenable microcapsules 2A, is formed on the surface of the photosensitive recording medium 3 having thereon the photosensitive microcapsules 2. At this exposing step, the photosensitive microcapsule layer may be exposed from the substrate side because of light transparent characteristics of the substrate 1.

Subsequently, the heating step shown in FIG. 2 will be explained. At this heating step, the original document 5 placed on the photosensitive recording medium 3 at the aforesaid exposing step is removed therefrom. Then, a heater 6 is turned on, while moving the photosensitive recording medium 3 or the heater 6 so as to shift the surface of the photosensitive recording medium, having thereon the photosensitive microcapsules 2, relative to the heater 6. By this process, each of the hardenable microcapsules 2A formed at the exposing step is hardened by heating with the heater 6 to become a hardened microcapsule 2B. Specifically, application of heat to the hardenable microcapsule 2A causes a reaction of the contents of the microcapsule with the stones or pits which is then hardened to become the hardened microcapsule 2B. In this way, a second chemical latent image, corresponding to the image pattern on the original document 5 and comprising the unexposed photosensitive microcapsules 2 and the hardened microcapsules 2B, is formed on the surface of the photosensitive recording medium 3 having thereon the photosensitive microcapsules 2.

Next, the re-exposing step shown in FIG. 3 will be explained. At this step, the entire surface of the photosensitive recording medium 3 having thereon the photosensitive microcapsules 2 is exposed again by the halogen lamp 4. When the halogen lamp 4 provided above the photosensitive recording medium 3 is turned on again, all of the remaining unexposed photosensitive microcapsules 2 become hardenable microcapsules 2A. At this time, the hardened microcapsules 2B formed at the aforesaid heating step remain unchanged. The important thing at this re-exposing step is that the entire surface of the photosensitive recording medium 3 having thereon the photosensitive microcapsules 2 is exposed with light. At this step, the photosensitive microcapsule 2 layer may also be re-exposed from the substrate 1 side.

Subsequently, the transferring step shown in FIG. 4 will be explained. At this transferring step, a plain sheet 7 serving as a transfer medium is superposed with the re-exposed surface of the photosensitive recording medium 3 having thereon the photosensitive microcapsules 2 to adhere thereto. Pressure and heat are simultaneously applied to the superposed photosensitive recording medium 3 and the plain sheet 7. Specifically, the photosensitive recording medium 3 and the plain sheet 7 pass between a pair of heat rollers 8 having therein a heat source, while pressure is applied. At this time, the photosensitive microcapsules 2 which have already become the hardened microcapsules 2B are not ruptured, so that the contents encapsulated therein do not flow out. On the other hand, the hardenable microcapsules 2A, which have not yet been hardened, are ruptured with the application of pressure, whereby the dyes encapsulated therein flow out to be transferred onto the plain sheet 7. Simultaneously, the dyes transferred onto the plain sheet 7 are heated by the heat rollers 8 and, since the microcapsule contents are hardenable, are hardened once heated. This is because each of the ruptured photosensitive microcapsules 2 has already been rendered hardenable. Accordingly, the dyes transferred onto the plain sheet 7 are hardened before soaking into the sheet 7, resulting in the image recorded on the plain sheet 7 not being blurred. Even if the medium to be transferred is an OHP sheet, the dyes are hardened before being repelled from the OHP sheet, thereby obtaining an excellent image thereon. As described above, a high-quality image corresponding to the image pattern on the original document 5 can be recorded on the optional transfer medium.

Subsequently, an image recording method for obtaining a color image according to the present invention will be explained hereinbelow as a second embodiment.

A first explanation is provided of a structure of a photosensitive recording medium 13 used for this embodiment on which photosensitive microcapsules 12 are deposited thereon. This photosensitive recording medium 13 comprises a substrate 11 and a large number of photosensitive microcapsules 12 deposited thereon. The substrate 11 is made of, for example, a polyethylene terephthalate film and has light transparent characteristics. The structure of the chemical composition or the like of the photosensitive microcapsules 12 used for the photosensitive recording medium 13 is disclosed in detail in Japanese Patent Laid-Open No. Sho 61-275742, so that the explanation thereof is omitted herein. The characteristics of the photosensitive microcapsules 12 will be briefly explained hereinbelow. The photosensitive microcapsules 12 comprise three kinds of microcapsules 12C, 12M and 12Y, each of which encapsulates respectively a dye or a pigment (hereinafter referred to as a dye) of cyan, magenta and yellow.

The photosensitive microcapsules 12C encapsulate the dye of cyan. Upon exposure with red light having a wavelength in the vicinity of 650 nm, a stone or pit is formed in the photosensitive microcapsule 12C which becomes hardenable. The hardenable photosensitive microcapsule 12C is hardened by heating to become a hardened microcapsule 12B.

The photosensitive microcapsule 12M encapsulates the dye of magenta. Upon exposure with green light having a wavelength in the vicinity of 550 nm, a stone or pit is formed in the photosensitive microcapsule 12M which becomes hardenable. The hardenable photosensitive microcapsule 12M is hardened by heating to become a hardened microcapsule 12B.

The photosensitive microcapsule 12Y encapsulates the dye of yellow. Upon exposure with blue light having a wavelength in the vicinity of 450 nm, a stone or pit is formed in the photosensitive microcapsule 12Y which becomes hardenable. The hardenable photosensitive microcapsule 12Y is hardened by heating to become a hardened microcapsule 12B.

As is apparent from the above, the wavelength of light for rendering a photosensitive microcapsule hardenable varies with each of the photosensitive microcapsules 12C, 12M and 12Y. When red light having a wavelength in the vicinity of 650 nm is radiated to each of the photosensitive microcapsules 12C, 12M and 12Y, only the photosensitive microcapsule 12C is hardenable, and the other photosensitive microcapsules 12M and 12Y are not hardenable. When green light having a wavelength in the vicinity of 550 nm is irradiated to each of the photosensitive microcapsules 12C, 12M and 12Y, only the photosensitive microcapsule 12M is hardenable, and the other photosensitive microcapsules 12C and 12Y are not hardenable. Similarly, when blue light having a wavelength in the vicinity of 450 nm is irradiated to each of the photosensitive microcapsules 12C, 12M and 12Y, only the photosensitive microcapsule 12Y is hardenable, and other photosensitive microcapsules 12C and 12M are not hardenable. The photosensitive microcapsule 12 which is exposed with light having a predetermined wavelength and which has not been rendered hardenable is not hardened even by heating.

Figure 5A:
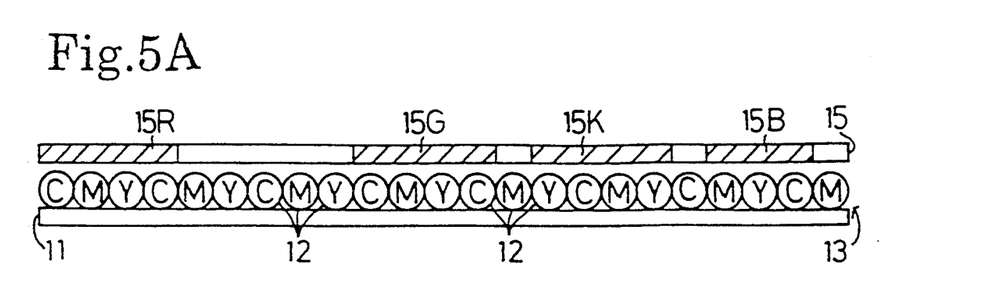
FIGS. 5A and 5B are views showing a step of exposing a photosensitive recording medium in the second embodiment.
Figure 5B:
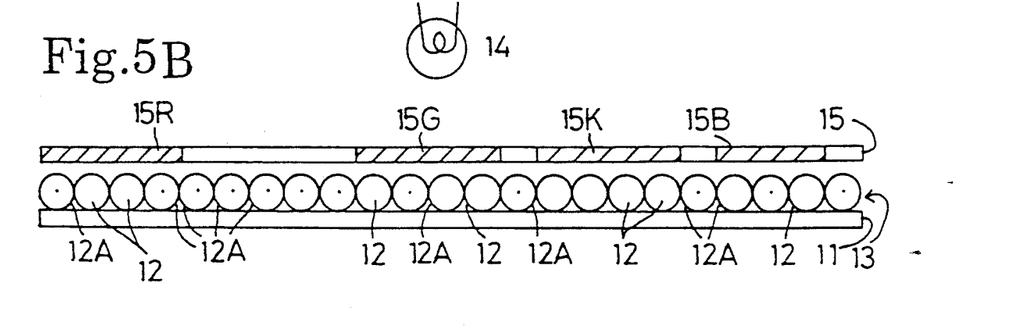
Figure 6:
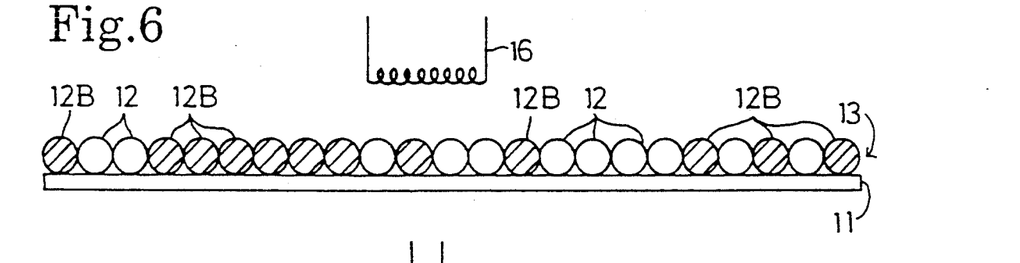
FIG. 6 is a view showing a step of heating the photosensitive recording medium in the second embodiment.
Figure 7:
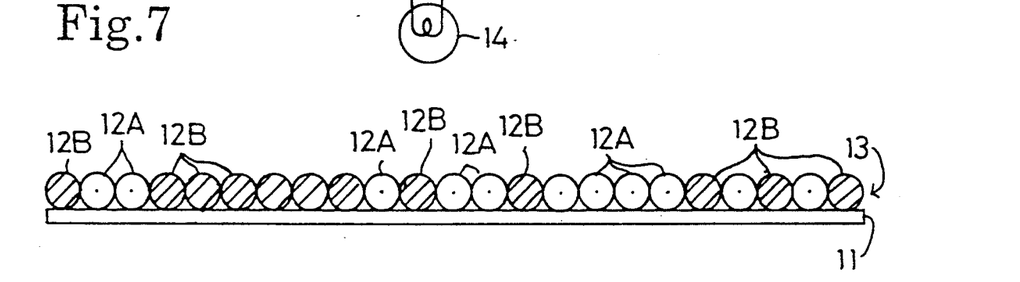
FIG. 7 is a view showing a step of re-exposing the photosensitive recording medium in the second embodiment.
Figure 8:
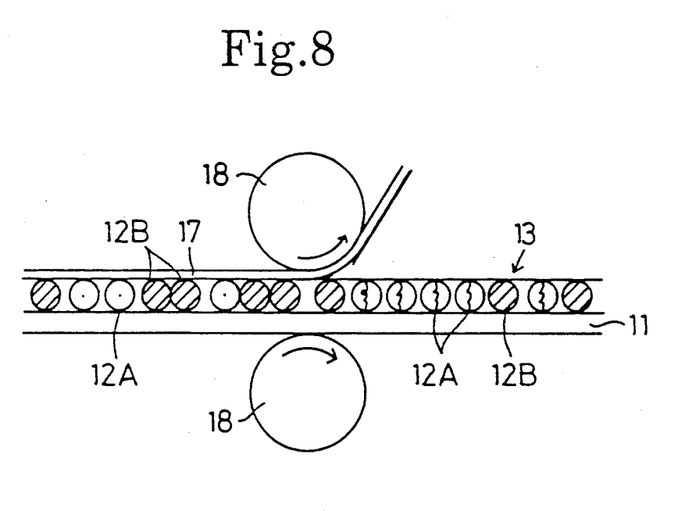
FIG. 8 is a view showing a step of transferring an image onto a transfer medium in the second embodiment.

An image recording method of the second embodiment will be explained with reference to FIGS. 5 to 8. FIGS. 5A and 5B are views showing an exposing step of the image recording method. FIG. 6 is a view showing a heating step of the image recording method. FIG. 7 is a view showing a re-exposing step of the image recording method. FIG. 8 is a view showing a transferring step of the image recording method.

The image recording method of this embodiment comprises an exposing step, a heating step, a re-exposing step and a transferring step, each of which will be explained hereinbelow. Explained in this embodiment is a case where the surface of the photosensitive recording medium 13 having thereon the photosensitive microcapsules 12 is exposed once by using an original color image having light transparent characteristics.

To begin with, the exposing step shown in FIGS. 5A and 5B will be explained. At this step, an original document 15 having light transparent characteristics is placed on the surface of the photosensitive recording medium 13 having thereon the photosensitive microcapsules 12 (see FIG. 5A). A color image is printed in advance on the original document 15. Portions 15R (red image), 15G (green image) and 15B (blue image) on which color images other than black are recorded have light transparent characteristics. Light passing through these portions has a frequency for each color. Specifically, the light passing through the portion 15R is red light having a wavelength in the vicinity of 650 nm. The light passing through the portion 15G is green light having a wavelength in the vicinity of 550 nm. The light passing through the portion 15B is blue light having a wavelength in the vicinity of 450 nm. A portion 15K on which the black image is recorded does not allow light to pass therethrough. All of the visible light can pass through portions having no color image recorded thereon. With this state, a halogen lamp 14, which is a light source, arranged above the original document 15 is turned on to expose the photosensitive microcapsules 12 on the photosensitive recording medium 13 with light passing through the original document 15. In the photosensitive microcapsules 12 below the color image portion 15R, only the photosensitive microcapsule 12C is rendered hardenable, and the other photosensitive microcapsules 12M and 12Y are not rendered hardenable, since the light passing through the color image portion 15R is red light having a wavelength in the vicinity of 650 nm. In the photosensitive microcapsules 12 below the color image portion 15G, only the photosensitive microcapsule 12M is rendered hardenable, and the other photosensitive microcapsules 12C and 12Y are not rendered hardenable, since the light passing through the color image portion 15G is green light having a wavelength in the vicinity of 550 nm. In the photosensitive microcapsules 12 below the color image portion 15B, only the photosensitive microcapsule 12Y is rendered hardenable, and the other photosensitive microcapsules 12C and 12M are not rendered hardenable, since the light passing through the color image portion 15B is blue light having a wavelength in the vicinity of 450 nm. This generates the exposed photosensitive microcapsules 12 which are exposed with light having a predetermined wavelength and the unexposed photosensitive microcapsules 12 which are not exposed with light having a predetermined wavelength. Each of the exposed photosensitive microcapsule 12 exposed with light having a predetermined wavelength is a hardenable microcapsule 12A. Each of the photosensitive microcapsules 12 which is not exposed with light having a predetermined wavelength is not rendered hardenable and remains intact. In other words, these photosensitive microcapsules 12 are not hardened even by heating. In this way, a first chemical latent image, corresponding to the image pattern on the original document 15 and comprising the unexposed photosensitive microcapsules 12 and exposed microcapsules with the latent image species 12A, is formed on the surface of the photosensitive recording medium 13 having thereon the photosensitive microcapsules 12 (see FIG. 5B).

Subsequently, the heating step shown in FIG. 6 will be explained. At this heating step, the original document 15 placed on the photosensitive recording medium 13 at the aforesaid exposing step is removed therefrom. Then, a heater 16 is turned on, while moving the photosensitive recording medium 13 or the heater 16 so as to shift the surface of the photosensitive recording medium 13 having thereon the photosensitive microcapsules 12 relative to the heater 16. By this process, each of the hardenable microcapsules 12A which is formed at the exposing step is hardened by heating with the heater 16 to become a hardened microcapsule 12B. Specifically, application of heat to the hardenable microcapsule 12A causes a reaction of species in the microcapsule with the stone or pit in the microcapsule 12A which is then hardened to become the hardened microcapsule 12B. In this way, a second chemical latent image, corresponding to the image pattern on the original document 15 and comprising the unexposed photosensitive microcapsules 12 and the hardened microcapsules 12B, is formed on the surface of the photosensitive recording medium 13 having thereon the photosensitive microcapsules 12.

Next, the re-exposing step shown in FIG. 7 will be explained. At this step, the entire surface of the photosensitive recording medium 13 having thereon the photosensitive microcapsules 12 after the heating step is exposed again by the halogen lamp 14. Re-exposure by the halogen lamp 14 allows all of the remaining unexposed photosensitive microcapsules 12 to become hardenable microcapsules 12A. The important thing at this re-exposing step is that the entire surface of the photosensitive recording medium 13 having the photosensitive microcapsules 12 thereon is exposed with white light having at least a wavelength of 450, 550 or 650 nm.

Subsequently, the transferring step shown in FIG. 8 will be explained. At this transferring step, a plain sheet 17 serving as a transfer medium is superposed with the re-exposed surface of the photosensitive recording medium 13 having thereon the photosensitive microcapsules 12 to adhere thereto. Pressure and heat are simultaneously applied to the superposed photosensitive recording medium 13 and the plain sheet 17. Specifically, the photosensitive recording medium 13 and the plain sheet 17 pass between a pair of heat rollers 18 having therein a heat source, while being applied with pressure. At this time, the hardenable but unhardened microcapsules 12A are ruptured with the application of pressure, whereby the dyes encapsulated therein flow out to be transferred onto the plain sheet 17. Simultaneously, the dyes transferred onto the plain sheet 17 are hardened by heating. Accordingly, the dyes transferred onto the plain sheet 17 are hardened before soaking into the sheet 17, resulting in the image recorded on the plain sheet 17 not being blurred. Even if the transfer medium is an OHP sheet, the dyes are hardened before being repelled from the OHP sheet, thereby obtaining an excellent image thereon. As described above, a high-quality image corresponding to the image pattern on the original document 15 can be recorded on the transfer medium.

The present invention is not limited to the above-mentioned embodiments, but various modifications can be made therein without departing from the scope of the invention.

For example, the exposure at the exposing step may be performed from the side of the substrate having light transparent characteristics.

Moreover, the original image may be read by a scanner or the like. The previously read original image may then be exposed with laser light or the like to the photosensitive microcapsule layer. In the case of the color original image, in particular, it may be read by a scanner or the like, and then, the previously read original image is divided into each color of red, green and blue for performing plural exposures of the image corresponding to each color on the photosensitive microcapsule layer.

Figure 9:
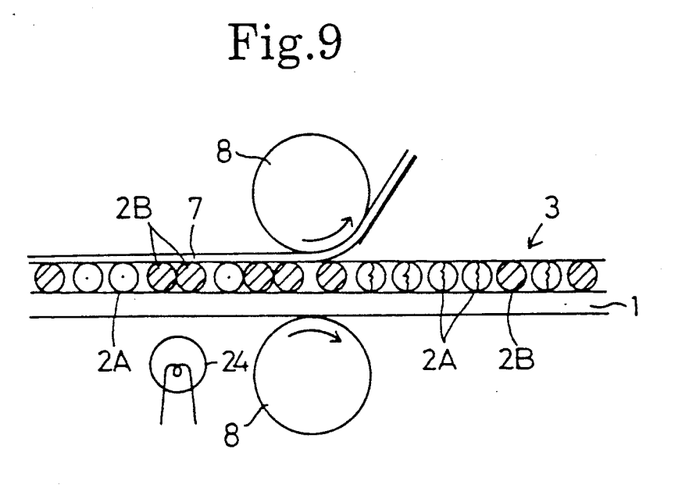
FIG. 9 is a view showing another image recording method according to the present invention.

Further, the re-exposing step and the transferring step may be simultaneously performed. For example, a light source 24 may be provided at the upstream side of the aforesaid heat rollers 8, so that the photosensitive microcapsule layer of the photosensitive recording medium is exposed from the side of the substrate having light transparent characteristics, immediately before the application of heat and pressure by the heat rollers 8.

Figure 10:
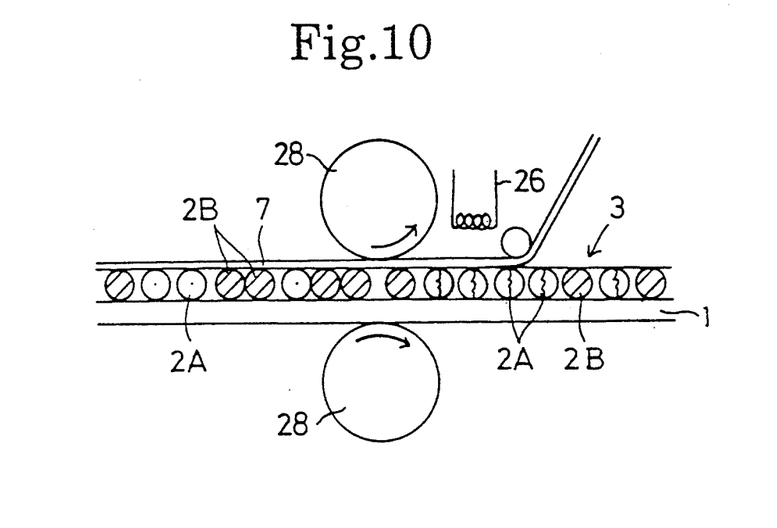
FIG. 10 is a view showing another image recording method according to the present invention.

Additionally, pressure and heat may be applied separately at the transferring step as shown in FIG. 10. Specifically, a heater 26 may be arranged at the downstream side of pressure rollers 28.

Figure 11:
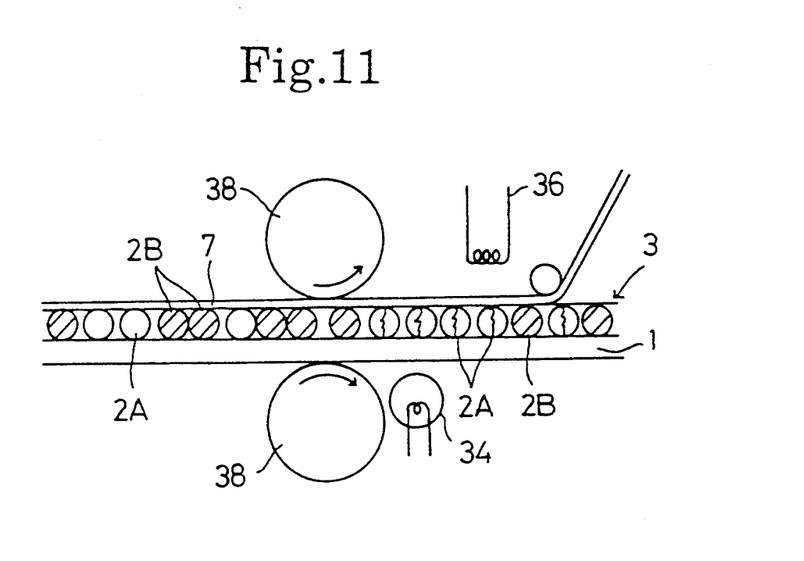
FIG. 11 is a view showing another image recording method according to the present invention.

Further, the re-exposing step and the transferring step can be changed as follows. As shown in FIG. 11, the photosensitive recording medium and the plain sheet which is a transfer medium are superposed with each other before re-exposure and are then pressed by a pair of pressure rollers 38 for rupturing the unhardened photosensitive microcapsules, whereby the contents encapsulated in the photosensitive microcapsules are transferred to the transfer medium. Thereafter, the transferred contents on the plain sheet are again exposed by a light source 34 arranged on the downstream side of the pressure rollers 38 to form latent image species. The plain sheet is heated by a heater 36 arranged on the downstream side of the light source 34, resulting in the image pattern corresponding to the original image being recorded on a transfer medium such as the plain sheet. Preferably, the transferred contents are cut off from the air and exposed to light.

As is apparent from the above, the image recording method according to the present invention is able to record an image on an optional transfer medium such as a plain sheet or the like without having a specific developer or absorbent, while preventing the contents in the photosensitive microcapsules from excessively soaking into or being repelled from the optional transfer medium. Further, the present invention can perform the image recording method of the present invention by modifying a conventional device without requiring a special device.

What is claimed is:

1. An image recording method for recording an image with use of photosensitive microcapsules, the microcapsules being hardenable upon exposure and being hardened by heating, the image recording method comprising the steps of:

exposing an image pattern to a photosensitive recording medium comprising a substrate having deposited thereon the photosensitive microcapsules, said exposing causing the exposed photosensitive microcapsules to be hardenable in correspondence with the image pattern;

after exposing, heating the exposed photosensitive recording medium for hardening the hardenable photosensitive microcapsules;

after heating, re-exposing an entire surface of the photosensitive recording medium having thereon the photosensitive microcapsules, for rendering all unexposed photosensitive microcapsules hardenable; and after re-exposing, applying pressure and heat to the photosensitive recording medium and a transfer medium, said photosensitive recording medium and said transfer medium being superposed with each other such that the surface of the photosensitive recording medium on which the photosensitive microcapsules are located is opposed to the transfer medium, thereby rupturing the unhardened hardenable photosensitive microcapsules for transferring the contents of the microcapsules onto the transfer medium and for hardening the microcapsule contents.

2. The image recording method according to claim 1, wherein said step of exposing said image pattern to said photosensitive recording medium comprises exposing said photosensitive recording medium to light through an original document having light transparent characteristics.

3. The image recording method according to claim 1, wherein said step of heating said exposed photosensitive recording medium comprises changing a relative position between a surface of said photosensitive recording medium and a heating means for heating said photosensitive recording medium.

4. The image recording method according to claim 1, wherein said step of re-exposing the entire surface of the photosensitive recording medium comprises re-exposing the entire surface of the photosensitive recording medium one time with light including at least a wave length of red, green and blue.

5. The image recording method according to claim 1, wherein said step of applying pressure and heat to the photosensitive recording medium and the transfer medium comprises passing said photosensitive recording medium and said transfer medium between a pair of heat rollers having therein a heat source after the photosensitive recording medium and the transfer medium are superposed with each other.

6. The image recording method according to claim 1, wherein said step of applying pressure and heat to the photosensitive recording medium and the transfer medium comprises the steps of:

passing said photosensitive recording medium and said transfer medium between a pair of pressure rollers after the photosensitive recording medium and the transfer medium are superposed with each other; and heating the transfer medium after the photosensitive recording medium and the transfer medium are separated.

* * * * *